(12) United States Patent
Aoki

(10) Patent No.: US 6,525,612 B2
(45) Date of Patent: Feb. 25, 2003

(54) MODE CONTROL OF PLL CIRCUIT

(75) Inventor: Koju Aoki, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/756,783

(22) Filed: Jan. 10, 2001

(65) Prior Publication Data

US 2002/0005763 A1 Jan. 17, 2002

(30) Foreign Application Priority Data

Jul. 11, 2000 (JP) ........................................ 2000-210001

(51) Int. Cl.[7] ................................................ H03L 7/087
(52) U.S. Cl. .............................. 331/11; 331/17; 331/25; 331/1 A; 331/DIG. 2; 327/156; 327/159; 327/157
(58) Field of Search ...................... 331/11, 17, DIG. 2, 331/1 A, 25; 327/156, 157, 159

(56) References Cited

U.S. PATENT DOCUMENTS 4,787,097 A * 11/1988 Rizzo ........................... 331/11
5,546,052 A * 8/1996 Austin et al. ................ 331/1 A

FOREIGN PATENT DOCUMENTS

JP 10-145229 5/1998

\* cited by examiner

Primary Examiner—Arnold Kinkead
(74) Attorney, Agent, or Firm—Arent Fox Kintner Plotkin & Kahn, PLLC

(57) ABSTRACT

A mode control circuit of a PLL circuit for switching the PLL circuit from a high-speed mode to a normal mode. The PLL circuit compares the phase of a reference signal and the phase of a comparison signal to generate a first pulse signal and a second pulse signal, and generates based on the first and second pulse signals a frequency signal that is locked at a desired frequency. The mode control circuit receives the first and second pulse signals from the PLL circuit, generates a mode switch signal representing the normal mode when a difference between a phase of the first pulse signal and a phase of the second pulse signal is within a predetermined range, and, after the mode is switched from the high-speed mode to the normal mode, generates the mode switch signal such that the normal mode is maintained.

15 Claims, 10 Drawing Sheets

(a)

(b)

MODE CONTROL OF PLL CIRCUIT

BACKGROUND OF THE INVENTION

The present invention relates to a phase-locked loop (PLL) circuit, and more particularly, to mode control of a PLL circuit operated in a high-speed mode and a normal mode.

A PLL circuit operated in a high-speed mode and a normal mode increases the loop gain to perform lockup at a high speed in the high speed mode. Subsequent to the locking, the PLL circuit decreases the loop gain in the normal mode (normal operation mode) to obtain a high carrier noise ratio (C/N) and a low spurious characteristic. The mode switching satisfies the demand for high-speed lockup and the demand for a high C/N and low spurious leak in a lock state.

The PLL circuit has a phase comparator that compares the phase of a reference signal with the phase of an oscillation frequency signal output from a voltage-controlled oscillator (VCO) to generate an up-pulse signal for increasing a frequency of the oscillation frequency signal and a down-pulse signal for decreasing a frequency of the oscillation frequency signal. The pulse width of each signal is based on the comparison result. A charge pump generates current based on the up-pulse and down-pulse signals. A low-pass filter generates a control voltage based on the charge pump output current to control the oscillation frequency signal of the VCO.

In a locked state in which the phases of the reference and oscillation frequency signals are matched, the output of a null current from the charge pump forms a dead zone in the PLL system. To prevent the formation of a dead zone, the phase comparator outputs an up current and a down current. In the locked state, the up and down currents affect the C/N and the spurious leak. Thus, the up and down currents are suppressed in the normal mode.

To shorten the lockup time in the high-speed mode, it is preferred that the charge pump outputs a greater amount of current than in the normal mode or the comparator outputs the up-pulse and down-pulse signals with a greater pulse width than in the normal mode.

The normal mode and the high-speed mode are switched by detecting the lock state from the output signal of the phase comparator. The PLL circuit switches to the normal mode when the difference between the frequencies of the reference signal and the oscillation frequency signal enters a predetermined range and switches to the high-speed mode when the frequency difference goes out of the predetermined range.

However, in the conventional PLL circuit, when the mode is switched from high-speed to normal, the PLL circuit may be released from the lock state causing the phase difference between the reference and oscillation signals to increase. In other words, when a mode signal switches the PLL circuit from a high-speed mode to a normal mode as shown in FIG. 1(a), the frequency lock is released as shown in FIG. 1(b). FIG. 1(c) is an output waveform diagram of the PLL circuit during a frequency lock of a PLL circuit having only the normal mode.

SUMMARY OF THE INVENTION

It is an object of the present invention to provide a PLL circuit that maintains a stable locked state when switched from a high-speed mode to a normal mode.

To achieve the above object, the present invention provides a mode control circuit for mode controlling a phase-locked loop (PLL) circuit having a high-speed mode in which a high-speed lockup operation is performed and a normal mode in which a normal PLL operation is performed. The PLL circuit compares the phase of a reference signal and the phase of a comparison signal to generate a first pulse signal and a second pulse signal, and generates based on the first and second pulse signals a frequency signal that is locked at a desired frequency. The mode control circuit receives the first and second pulse signals from the PLL circuit, generates a mode switch signal representing the normal mode when a difference between a phase of the first pulse signal and a phase of the second pulse signal is within a predetermined range, and, after the mode is switched from the high-speed mode to the normal mode, generates the mode switch signal such that the normal mode is maintained.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1A:
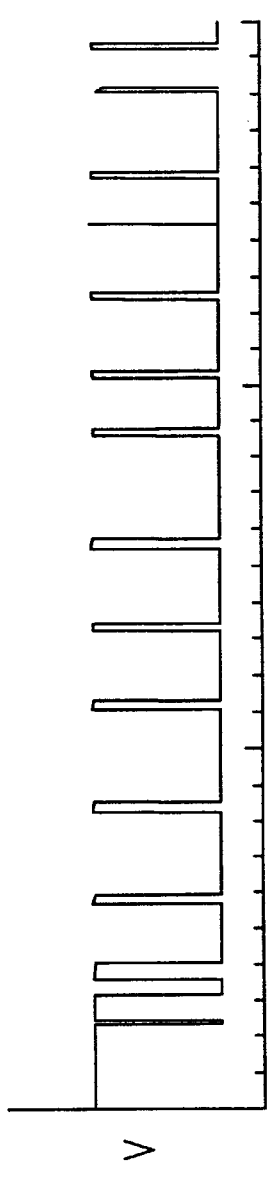
FIG. 1(a) is a diagram showing the waveform of a mode switch signal of a prior art PLL circuit.
Figure 1B:
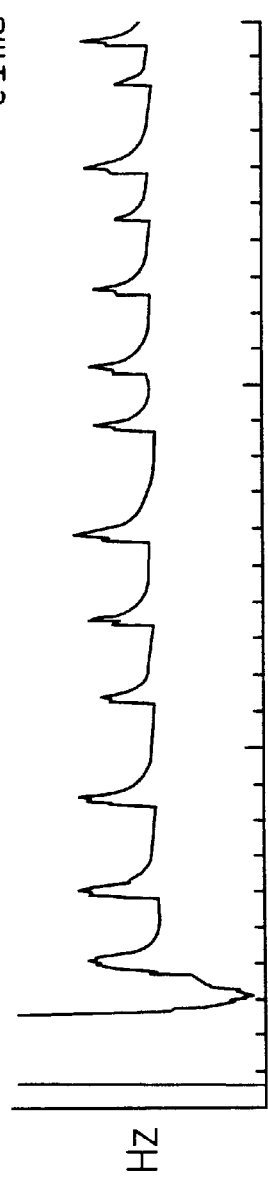
FIG. 1(b) is a diagram showing the waveform of an output signal of the PLL circuit of FIG. 1(a)
Figure 1C:
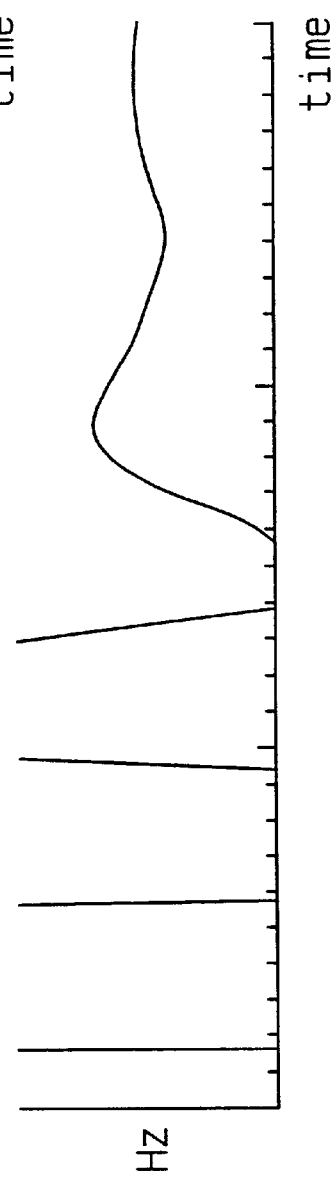
FIG. 1(c) is a diagram showing the waveform of an output signal during a lock state in a prior art PLL circuit operated only in a normal mode.

In the drawings, like numerals are used for like elements throughout.

Figure 2:
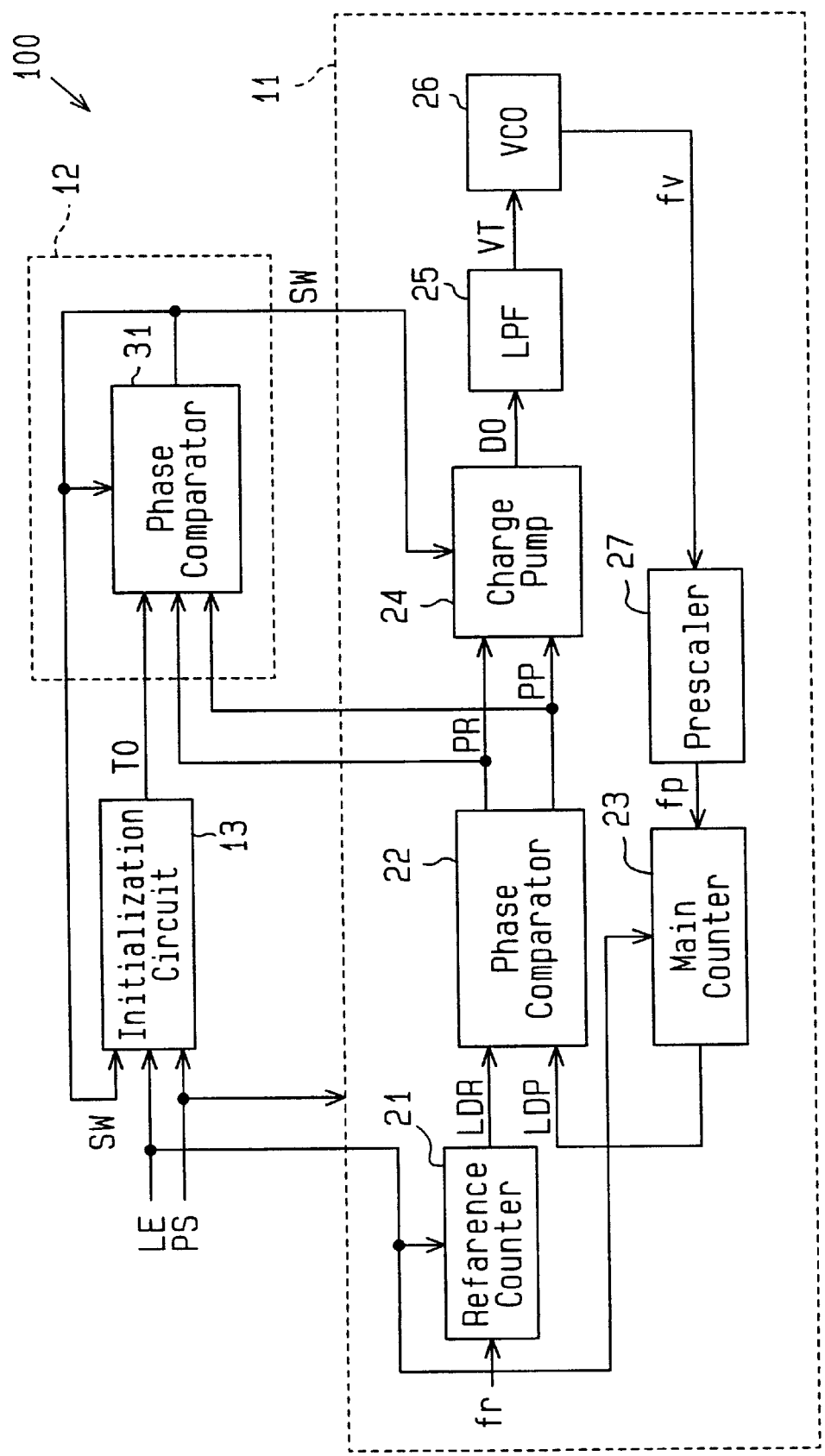
FIG. 2 is a schematic block diagram of a PLL circuit and a mode control circuit according to a first embodiment of the present invention.

FIG. 2 is a schematic block diagram of a semiconductor integrated circuit device 100 according to a first embodiment of the present invention. The semiconductor integrated circuit device 100 includes a PLL circuit 11, a mode control circuit 12, and an initialization circuit 13.

The PLL circuit 11 switches between a high-speed mode and a normal mode. In the high-speed mode, the PLL circuit 11 increases the loop gain to perform high-speed lockup. In the normal mode, the PLL circuit 11 decreases the loop gain to obtain a high C/N and a low spurious characteristic. The mode control circuit 12 receives pulse signals PR, PP from the PLL circuit 11 and generates a mode switch signal SW. The initialization circuit 13 generates an initialization signal TO based on the mode switch signal SW, a frequency dividing ratio setting signal LE, and a power save signal PS to initialize the mode control circuit 12.

The PLL circuit 11 includes a reference counter 21 functioning as a reference frequency divider, a phase comparator 22, a main counter 23 functioning as a comparison frequency divider, a charge pump 24, a low-pass filter (LPF) 25, a voltage-controlled oscillator (VCO) 26, and a prescaler 27.

The reference counter 21 receives a reference signal fr and generates a reference signal LDR by dividing the reference signal fr by a predetermined frequency dividing ratio. The reference signal fr is generated, for example, by the oscillation of a crystal oscillator. The phase comparator 22 receives the divided reference signal LDR from the reference counter 21 and a frequency divided comparison signal LDP from the main counter 23. Then, the phase comparator 22 generates an up-pulse signal PR and a down-pulse signal PP. The up-pulse and down-pulse signals PR, PP each have a pulse width corresponding to the phase difference between the divided reference signal LDR and the frequency divided comparison signal LDP.

The charge pump 24 generates a charge pump output signal DO having a current value that is based on the up-pulse and down pulse signals PR, PP. The LPF 25 smoothes the charge pump output signal DO and generates a control signal VT having a DC current value voltage from which high-frequency components are eliminated. The VCO 26 generates an oscillation frequency signal fv having a frequency that is based on the voltage of the control signal VT. The oscillation frequency signal fv is provided to the prescaler 27 and an external circuit (not shown).

The prescaler 27 divides the oscillation frequency signal fv by a fixed frequency dividing ratio to generate a comparison signal fp. The main counter 23 receives the comparison signal fp from the prescaler 27, divides the comparison signal fp by a predetermined dividing ratio, and provides the phase comparator 22 with the divided comparison signal LDP.

In the PLL circuit 11, when the frequency of the oscillation frequency signal fv is lower than a desired frequency, the frequency of the comparison signal fp becomes lower than the frequency of the reference signal fr, and a phase difference is formed between the reference signal fr and the comparison signal fp. The phase comparator 22 generates the up-pulse signal PR and the down-pulse signal PP so that they each have a pulse width that is based on the phase difference. The phase comparator 22, for example, generates the up-pulse signal PR with a pulse width that is greater than that of the down-pulse signal PP.

The charge pump 24 provides the LPF 25 with the charge pump output signal DO, which is based on the pulse width of the up-pulse signal PR and the down-pulse signal PP. The LPF 25 varies the voltage of the control signal VT based on the charge pump output signal DO. In this case, the LPF 25 increases the voltage of the control signal VT, and the VCO 26 generates the oscillation frequency signal fv, which has a high frequency, based on the control signal VT.

When the frequency of the oscillation frequency signal fv is higher than a lock frequency, the frequency of the comparison signal fp is higher than that of the reference signal fr. This forms a phase difference between the reference signal fr and the comparison signal fp. The up-pulse signal PR and the down-pulse signal PP generated by the phase comparator 22 each have a pulse width that is in accordance with the phase difference.

The charge pump 24 provides the LPF 25 with the charge pump output signal DO, which is based on the pulse width of the up-pulse signal PR and the down-pulse signal PP. The LPF 25 decreases the voltage of the control signal VT based on the charge pump output signal DO. The VCO 26 generates the oscillation frequency signal fv, which has a low frequency, based on the control signal VT.

The PLL circuit 11 repeats the above operation to lock the oscillation frequency signal fv at a predetermined frequency.

The charge pump 24 varies the current amount of the charge pump output signal DO in response to the mode switch signal SW from the mode control circuit 12. That is, the charge pump 24 provides the LPF 25 with a current greater than that during the normal mode when the mode switch signal SW represents the high-speed mode. The increased current amount increases the frequency fluctuation of the oscillation frequency signal fv output from the VCO 26 during the high-speed mode so that the frequency of the oscillation frequency signal quickly reaches the target frequency. The frequency fluctuation of the oscillation frequency signal fv during the normal mode decreases and stabilizes the frequency.

The reference counter 21 and the main counter 23 receives a frequency dividing ratio setting signal LE from a microcomputer (not shown) and sets the frequency dividing ratio based on the frequency dividing ratio setting signal LE.

The PLL circuit 11 receives the power save signal PS from the microcomputer and sets a power save mode or a normal operation mode based on the power save signal PS. For example, the PLL circuit 11 enters the power save mode when the power save signal PS is low and stops operation of all of its circuits. The PLL circuit 11 enters the normal operation when the power save signal PS is high. Power consumption decreases during the power save mode.

The mode control circuit 12 preferably includes a phase comparator 31. The phase comparator 31 receives the up-pulse signal PR and the down-pulse signal PP from the phase comparator 22 and generates the mode switch signal SW based on the phase difference between the up-pulse and down-pulse signals PR, PP. The mode switch signal SW is fed back to the phase comparator 31. The phase comparator 31 receives the initialization signal TO from the initialization circuit 13.

The phase difference between the up-pulse and down-pulse signals PR, PP increases as the frequency difference between the frequency dividing reference signal LDR and the frequency divided comparison signal LDP increases. Accordingly, the phase comparator 31 generates the mode switch signal SW at a high level, which represents the high-speed mode, when the phase difference between the up-pulse and down-pulse signals PR, PP is a predetermined value or greater. The phase comparator 31 generates the mode switch signal SW at a low level, which represents the normal mode, when the phase difference between the up-pulse and down-pulse signals PR, PP is lower than the predetermined value.

The mode switch signal SW is fed back to the phase comparator 31. In response to the feedback mode switch signal SW and after the PLL circuit 11 is switched from the high-speed mode to the normal mode, the phase comparator 31 locks the mode switch signal SW so as to maintain the normal mode. That is, when the feedback mode switch signal SW is low, the phase comparator 31 stops phase comparison, invalidates the up-pulse and down-pulse signals PR, PP, and maintains the mode switch signal SW at the low level.

Figure 7:
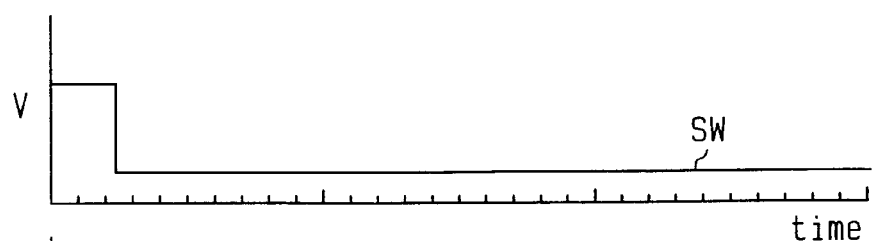
FIG. 7(a) is a waveform diagram illustrating a mode switch signal generated by the mode control circuit of FIG. 2.
FIG. 7(b) is a waveform diagram illustrating an output signal of the PLL circuit of FIG. 2 in a lock state.
Figure 7:
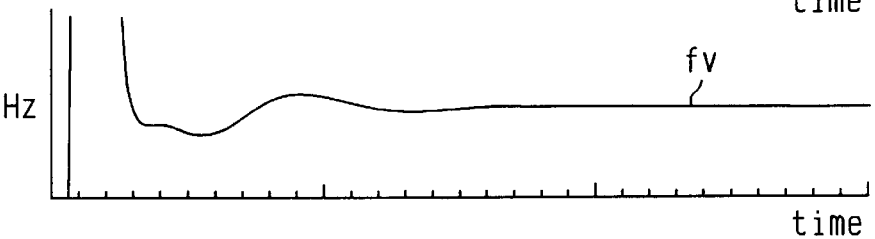

As shown in FIG. 7(a), after switching the mode switch signal SW from the high level to the low level, the mode control circuit 12 maintains the mode shift signal SW at the low level. Accordingly, the PLL circuit 11 does not enter the high-speed mode when switched from the high-speed mode to the normal mode in response to the mode switch signal SW. By maintaining the normal mode in this manner, frequency lock is maintained when the mode is switched as shown in FIG. 7(b). Accordingly, a delay in the lockup time does not occur due to the frequency lock being released when the mode is switched, and frequency lock is quickly performed.

The phase comparator 31 performs initialization in response to the initialization signal TO and outputs the mode switch signal SW at a high level to operate the PLL circuit 11 in the high-speed mode. The feedback of the high mode switch signal SW causes the phase comparator 31 to validate the up-pulse signal PR and the down-pulse signal PP and start phase comparison.

Figure 3:
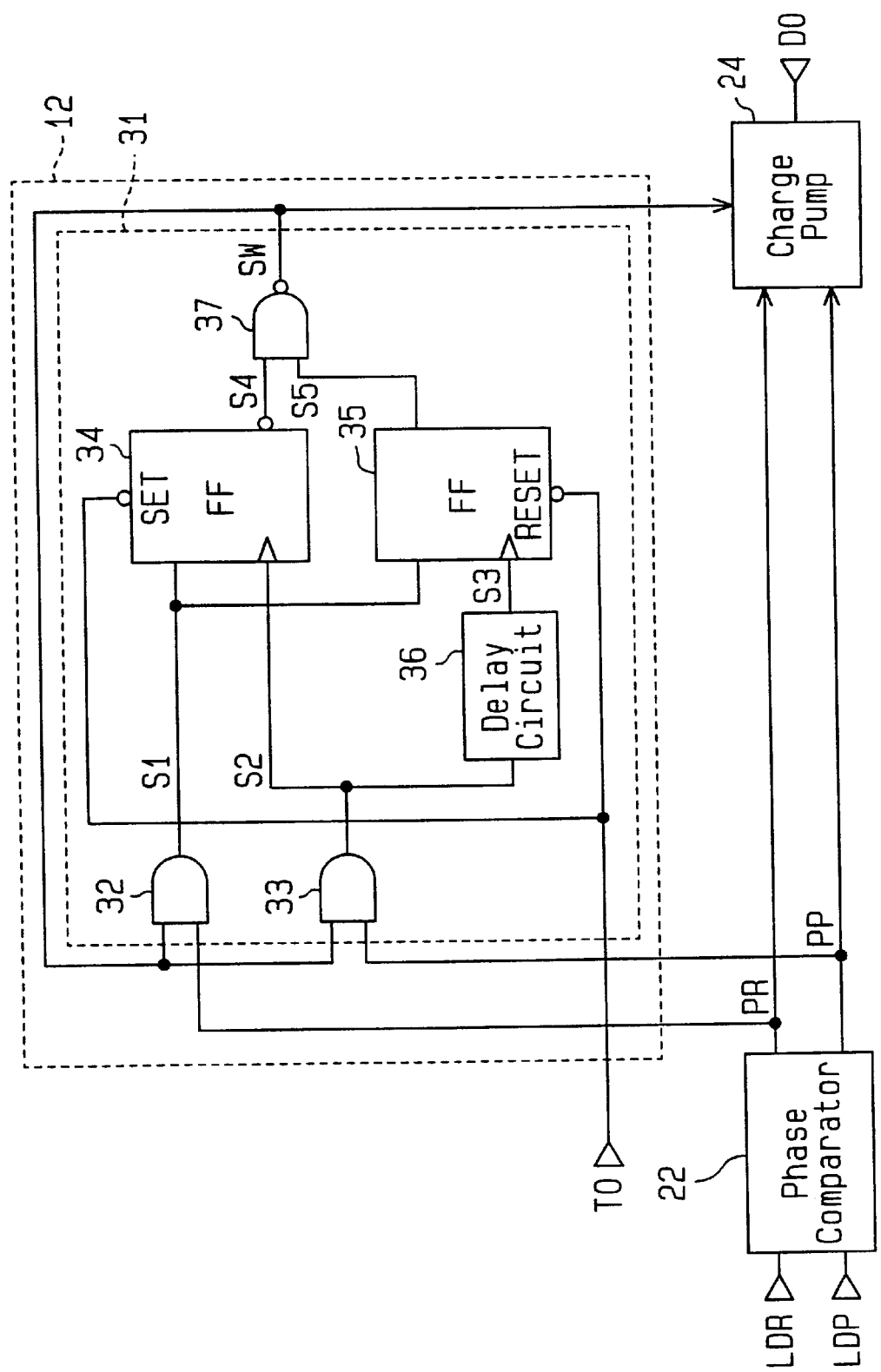
FIG. 3 is a more detailed schematic block diagram of the mode control circuit of FIG. 2.

FIG. 3 is a schematic block diagram of the phase comparator 31. The phase comparator 31 includes two AND circuits 32, 33, two flip-flops (FF) 34, 35, a delay circuit 36, and a NAND circuit 37.

The first AND circuit 32 has a first input terminal provided with the up-pulse signal PR, a second input terminal provided with the mode switch signal SW, and an output terminal connected to data input terminals of the first and second FFs 34, 35. The second AND circuit 33 has a first input terminal provided with the down-pulse signal PP, a second input terminal provided with the mode switch signal SW, and an output terminal connected to a clock input terminal of the first FF 34 and to the clock input terminal of the second FF 35 via the delay circuit 36.

The first FF 34 has a set input terminal provided with the initialization signal TO. The second FF 35 has a reset input terminal provided with the initialization signal TO.

The first FF has an inverting output terminal connected to a first input terminal of the NAND circuit 37. The NAND circuit 37 has a second input terminal connected to an output terminal of the second FF 35. The NAND circuit 37 outputs the mode switch signal SW.

Figure 4:
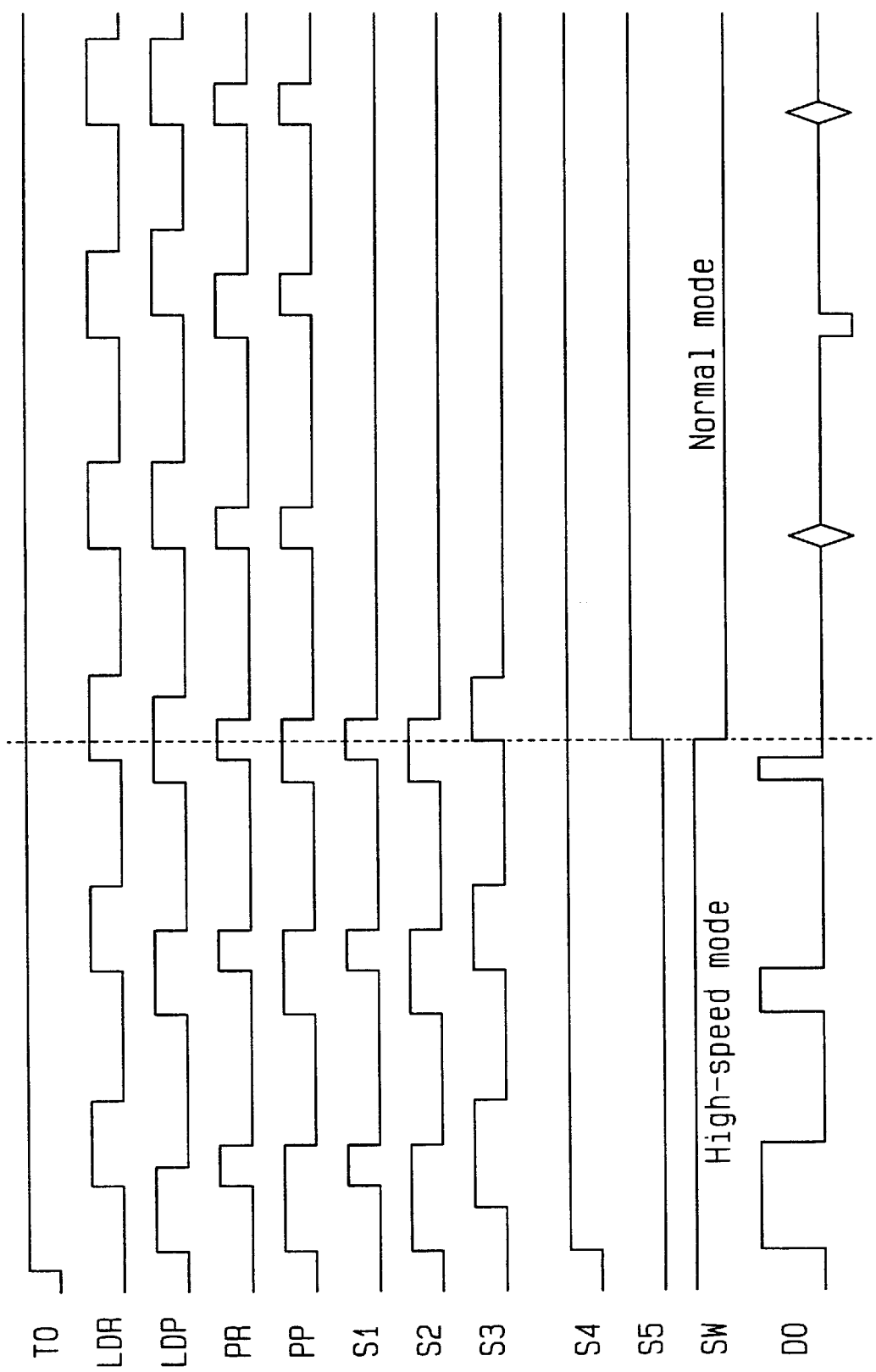
FIG. 4 is a waveform diagram illustrating the operation of the PLL circuit and the mode control circuit of FIG. 2.

Referring to FIG. 4, when the PLL circuit 11 is being operated in the high-speed mode, the first AND circuit 32 generates a first AND output signal S1, which is identical to the up-pulse signal PR, and the second AND circuit 33 generates a second AND signal S2, which is identical to the down-pulse signal PP. The delay circuit 36 has a plurality of OR circuits (not shown) and delays the second AND signal S2 for a predetermined time based on the number of the OR circuits to generate a delayed signal S3.

When the delayed signal S3 goes high while the first AND signal S1 is high, the FF output signals S4 and S5 provided to the NAND circuit 37 both become high. Thus, the NAND circuit 37 outputs the mode switch signal SW at a low level causing the PLL circuit 11 to operate in the normal mode. That is, the FF output signals S4, S5 are generated at a high level when the time difference between the rising edges of the up-pulse signal PR and the down-pulse signal PP is within the predetermined delay time of the delay circuit 36.

When the mode switch signal SW goes low, the first AND signal S1 of the first AND circuit 32 and the second AND signal of the second AND circuit 33 both go low. The first AND signal S1 and the delayed signal S3 respectively provided to the data input terminal of the first FF 34 and the clock input terminal of the second FF 35 have the same level. Thus, the FF output signals S4, S5 are not changed. Accordingly, the phase comparator 31 maintains the mode switch signal SW at the low level.

Then, when the initialization signal TO provided to the first and second FFs 34, 35 go low, the FF output signal S4 of the first FF 34 and the FF output signal S5 of the second FF 35 that are provided to the NAND circuit 37 go low. In response to the low FF output signal S4, S5, the NAND circuit 37 outputs the mode switch signal SW at a high level and the PLL circuit 11 is operated in the high-speed mode.

The waveform of the first AND signal S1 output by the first AND circuit 32 is identical to that of the up-pulse signal PR, and the waveform of the second AND signal S2 output by the second AND circuit 33 is identical to that of the down-pulse signal PP. Thus, when the mode switch signal SW goes high, the phase comparator 31 starts detection of the phase difference between the up-pulse signal PR and the down-pulse signal PP.

Figure 5:
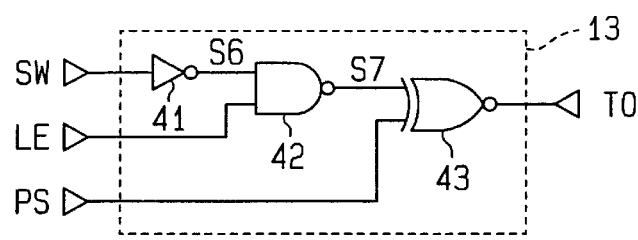
FIG. 5 is a schematic block diagram of an initialization circuit according to the present invention.

FIG. 5 is a schematic block diagram of the initialization circuit 13.

The initialization circuit 13 includes an inverter circuit 41, a NAND circuit 42, and an exclusive NOR circuit 43. The inverter circuit 41 inverts the mode switch signal SW and provides the NAND circuit 42 with an inverted signal S6. The NAND circuit 42 receives the frequency dividing ratio setting signal LE and the inverted signal S6 and provides the exclusive NOR circuit 43 with a NAND output signal S7. The exclusive NOR circuit 43 receives the power save signal PS and the NAND output signal S7 to generate an initialization signal TO.

Figure 6:
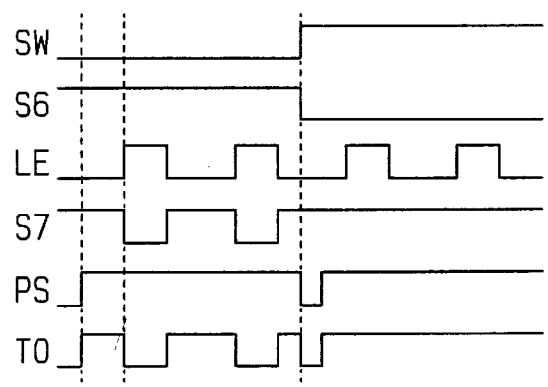
FIG. 6 is a waveform diagram illustrating the operation of the initialization circuit of FIG. 5.

With reference to FIG. 6, when the PLL circuit is switched from the power save mode (the power save signal PS being low) to the normal operation mode (the power save signal PS being high), the initialization circuit 13 outputs the initialization signal TO at a low level so as to operate the PLL circuit 11 in the high-speed mode. Further, when the frequency dividing ratio setting signal LE goes high to vary the frequency dividing ratio setting of the reference counter 21 and the main counter (to change the lock frequency), the initialization circuit 13 outputs the initialization signal TO at a low level. In response to the low initialization signal TO, the mode control circuit 12 generates the mode switch signal SW at a high level, which represents the high-speed mode.

The semiconductor integrated circuit device 100 of the first embodiment has the advantages described below.

(1) When the phase difference between the up-pulse signal PR and the down-pulse signal PP is within a predetermined range, the mode control circuit 12 switches the PLL circuit 11 from the high-speed mode to the normal mode with the mode switch signal SW and maintains the normal mode. As a result, the PLL circuit 11 does not switch back to the high-speed mode. Thus, the frequency lock is not released when the mode is switched, the lockup time is not delayed, and the frequency lock is quickly performed.

(2) The initialization circuit 13 generates the initialization signal TO based on the mode switch signal SW, the frequency dividing ratio setting signal LE, and the power save signal PS. In response to the initialization signal TO, the mode control circuit 12 generates the mode switch signal SW at a level representing the high-speed mode. As a result, the lockup operation is performed in the high-speed mode when the PLL circuit 11 is switched from the power save mode to the normal operation mode or when the frequency channel is switched.

Figure 8:
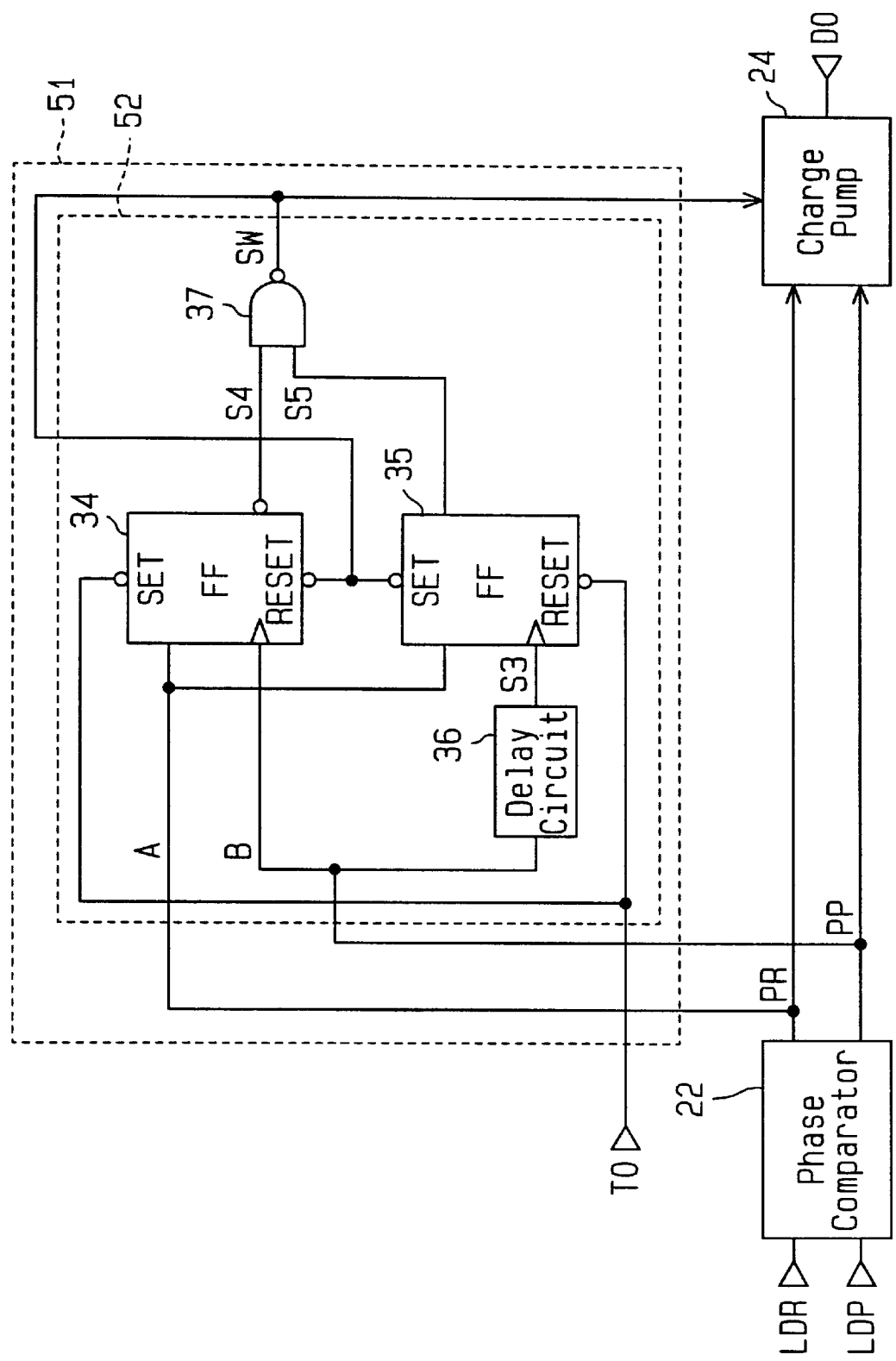
FIG. 8 is a schematic block diagram of a mode control circuit according to a second embodiment of the present invention.

FIG. 8 is a schematic block diagram of a mode control circuit 51 according to a second embodiment of the present invention. The mode control circuit 51 has a phase comparator 52, which includes a first FF 34, a second FF 35, a delay circuit 36, and a NAND circuit 37.

The data input terminals of the first and second FFs 34, 35 are provided with the up-pulse signal PR. The clock input terminal of the first FF 34 is provided with the down-pulse signal PP. The down-pulse signal PP is also provided as the delayed signal S3 to the clock input terminal of the second FF 35 via the delay circuit 36. The NAND circuit 37 is provided with the FF output signal S4 from the inverting output terminal of the first FF 34 and the FF output signal S5 from the output terminal of the second FF 35. The mode switch signal SW is output from the NAND circuit 37.

The set input terminal of the first FF 34 and the reset input terminal of the second FF 35 are provided with the initialization signal TO. The mode switch signal SW is provided to the reset input terminal of the first FF 34 and the set input terminal of the second FF 35.

Figure 9:
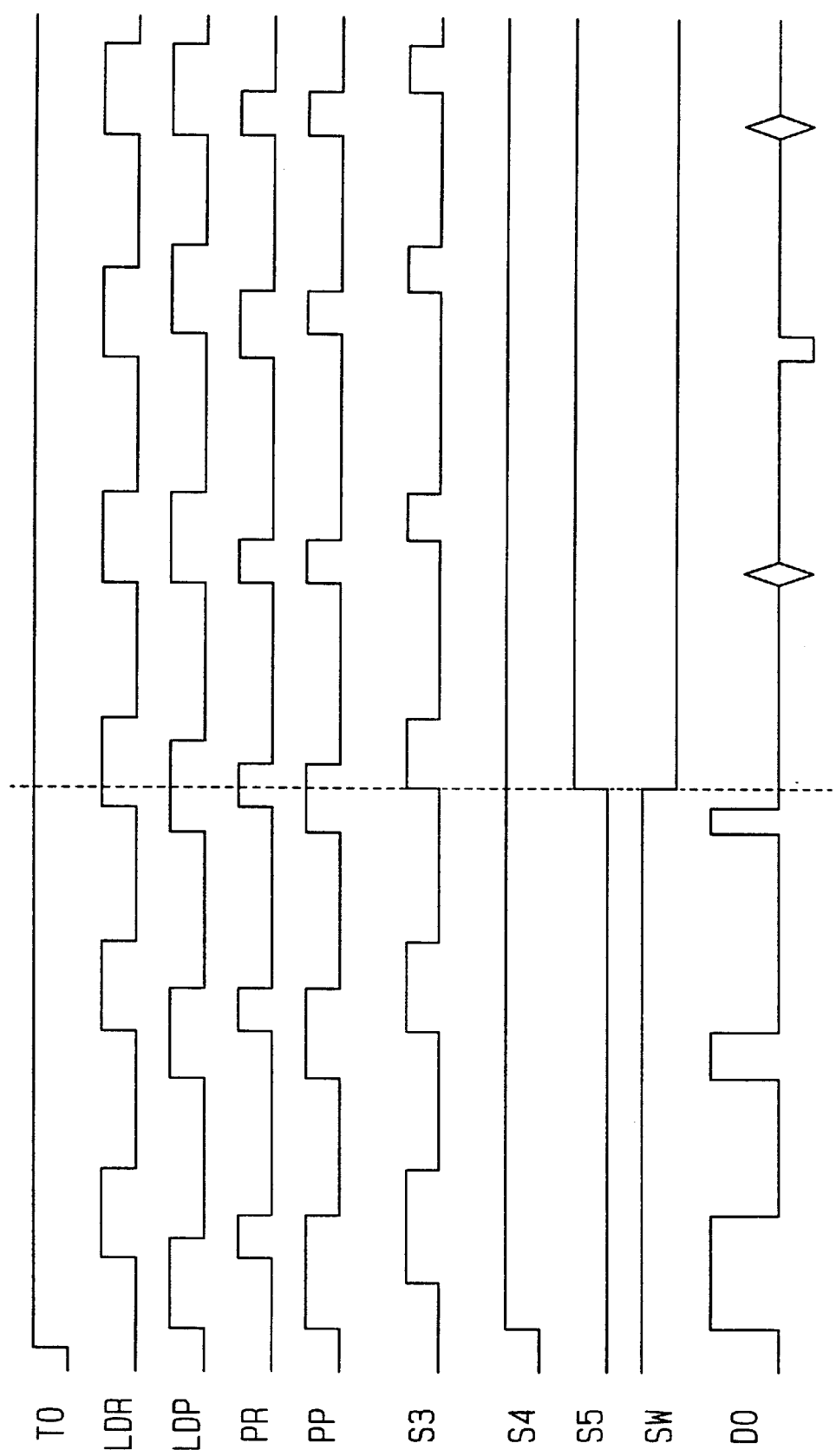
FIG. 9 is a waveform diagram illustrating the operation of the mode control circuit of FIG. 8.

Referring to FIG. 9, the delay circuit 36 includes a plurality of OR circuits (not shown) and delays the down-pulse signal PP by a predetermined delay time, which is set by the OR circuits, to generate the delayed signal S3.

If the delayed signal S3 goes high while the up-pulse signal PR is high, the FF output signals S4, S5 of the respective first and second FFs 34, 35 both become high. Thus, the NAND circuit 37 outputs the mode switch signal SW at the low level and operates the PLL circuit 11 in the normal mode. In other words, when the time difference between the rising edges of the up-pulse signal PR and the down-pulse signal PP is within a predetermined time, the first and second FFs 34, 35 output the FF output signal S4, S5 at a high level.

The low mode switch signal SW is fed back to the reset input terminal of the first FF 34 and the set input terminal of the second FF 35. In response to the low mode switch signal SW, the FF output signal S4 of the first FF 34 and the FF output signal S5 of the second FF 35 go high. The high FF output signals S4, S5 are provided to the NAND circuit 37. Thus, the NAND circuit 37 outputs the mode switch signal SW at a low level.

The feedback of the low mode switch signal SW to the reset input terminal of the first FF 34 and the set terminal of the second FF 35 locks the FF output signals S4, S5 of the respective first and second FFs 34, 35 at the high level and locks the mode switch signal SW at the low level. By locking the mode switch signal SW in this manner, after the PLL circuit 11 switches to the normal mode from the high-speed mode, the PLL circuit 11 maintains the normal mode.

When the initialization signal TO provided to the first and second FFs 34, 35 goes low, the FF output signal S4 of the first FF and the FF output signal S5 of the second FF go low. The low FF output signals S4, S5 are provided to the NAND circuit 37, and the NAND circuit outputs the mode switch signal SW at a high level. This operates the PLL circuit in the high-speed mode.

The mode control circuit 51 of the second embodiment provides the mode switch signal SW to the reset terminal of the first FF 34 and the set terminal of the second FF 35. This eliminates the need for two AND circuits and decreases the circuit scale of the mode control circuit 51.

Figure 10:
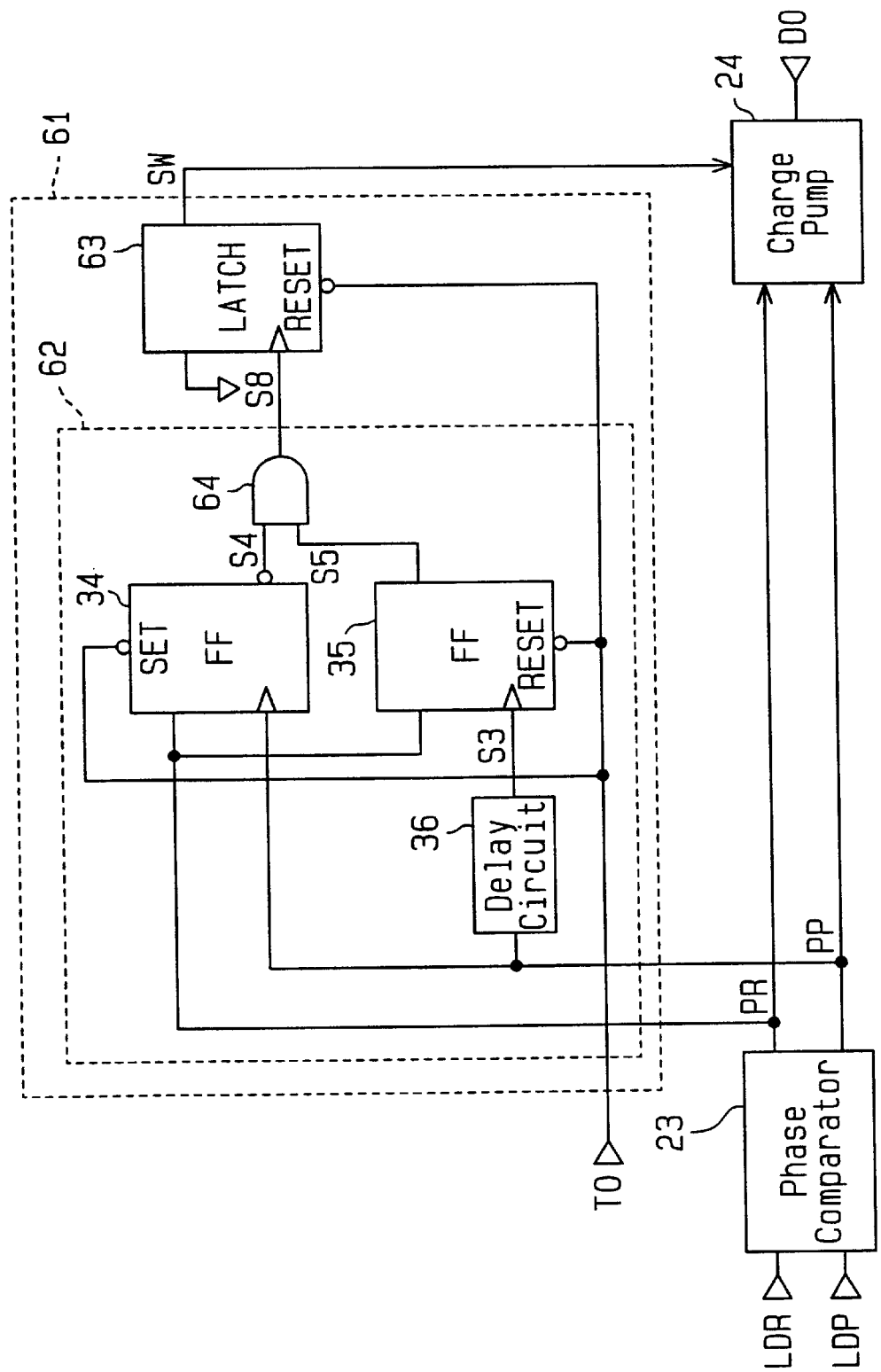
FIG. 10 is a schematic block diagram of a mode control circuit according to a third embodiment of the present invention.

FIG. 10 is a schematic block diagram of a mode control circuit 61 according to a third embodiment of the present invention. The mode control circuit 61 has a phase comparator 62 and a latch circuit (LATCH) 63. The phase comparator 62 includes a first FF 34, a second FF 35, a delay circuit 36, and an AND circuit 64.

The data input terminals of the first and second FFs 34, 35 are provided with the up-pulse signal PR. The clock input terminal of the first FF 34 is provided with the down-pulse signal PP. The down-pulse signal PP is also provided as the delayed signal S3 to the clock input terminal of the second FF 35 via the delay circuit 36. The set input terminal of the first FF 34 and the reset input terminal of the second FF 35 are provided with the initialization signal TO. The AND circuit 64 is provided with the FF output signal S4 from the inverting output terminal of the first FF 34 and the FF output signal S5 from the output terminal of the second FF 35. The AND circuit 64 provides a strobe input terminal of the latch circuit 63 with an AND output signal (comparison result signal) S8. The latch circuit 63 has a data input terminal connected to the ground and a reset input terminal provided with the initialization signal TO.

When the initialization signal TO provided to the reset input terminal of the latch circuit 63 goes high and the AND signal S8 provided to the strobe input terminal of the latch circuit 63 goes high, the mode switch signal SW output from the latch circuit 63 goes low. In this state, since the data input terminal of the latch circuit 63 is connected to the ground and locked at the low level, the latch circuit 63 maintains the mode switch signal SW at the low level regardless of the level of the AND output signal S8. Accordingly, after the PLL circuit 11 switches from the high-speed mode to the normal mode, the PLL circuit 11 maintains the normal mode.

Figure 11:
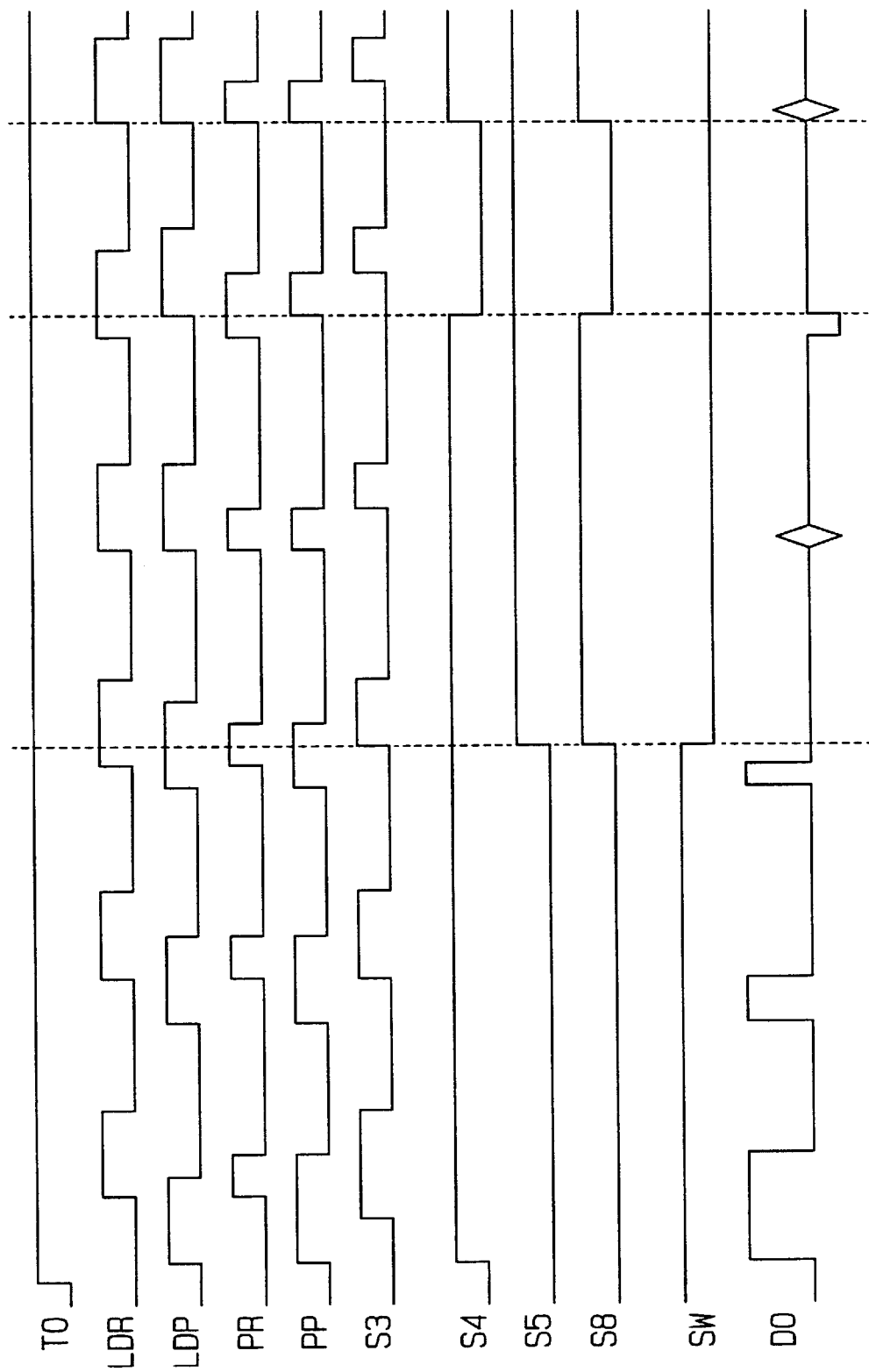
FIG. 11 is a waveform diagram illustrating the operation of the mode control circuit of FIG. 10.

Then, as shown in FIG. 11, when the initialization signal TO provided to the reset input terminal of the latch circuit 63 goes low to vary the lock frequency or switch the PLL circuit 11 from the power save mode to the normal operation mode, the mode switch signal SW output by the latch circuit 63 goes high. That is, when the phase difference between the up-pulse signal PR and the down-pulse signal PP is within a predetermined range, the mode switch signal SW is maintained at the low level until the mode control circuit 61 is provided with the low initialization signal TO.

In the mode control circuit 61 according to the third embodiment, the AND output signal S8 from the phase comparator 62 is latched by the latch circuit 63. Thus, the mode switch signal SW is easily locked.

It should be apparent to those skilled in the art that the present invention may be embodied in many other specific forms without departing from the spirit or scope of the invention. Particularly, it should be understood that the present invention may be embodied in the following forms:

(a) In the first embodiment, instead of the two AND circuits 32, 33, the up and down pulse signals PR, PP may be locked by a single gate circuit or two or more gate circuits.

Figure 12:
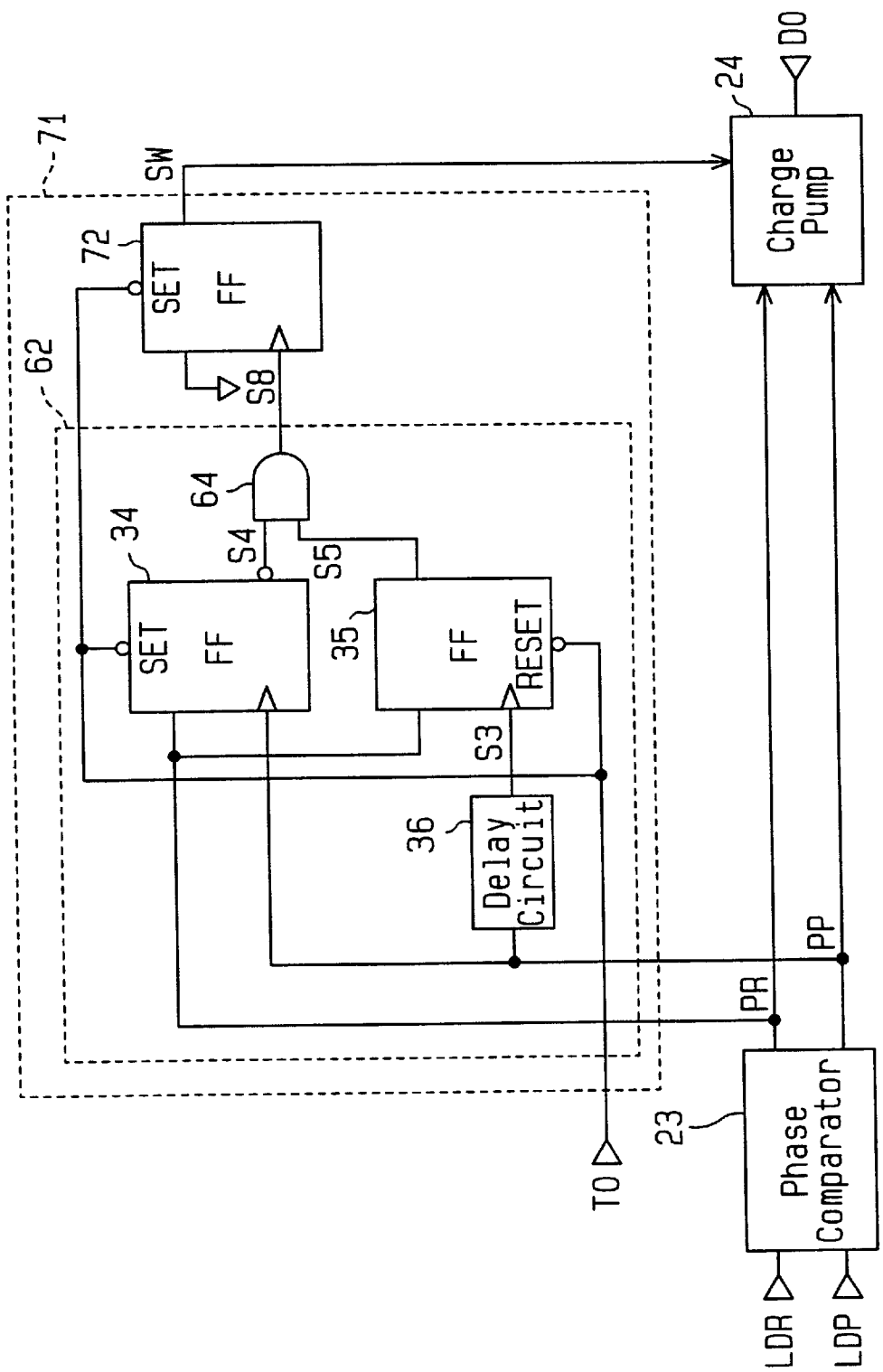
FIG. 12 is a schematic block diagram of another aspect of the mode control circuit according to a third embodiment of the present invention.

(b) In the third embodiment, a flip-flop circuit (FF) 72 such as that shown in FIG. 12 may be employed in lieu of the latch circuit 63. The FF 72 has a clock input terminal provided with the AND output signal S8 from the phase comparator 62, a set input terminal provided with the initialization signal TO, and a data input terminal connected to the ground. The mode switch signal SW is output from the output terminal of the FF 72. A mode control circuit 71 incorporating the FF 72 also maintains the PLL circuit 11 in a normal mode after the PLL circuit 11 is switched from the high-speed mode to the normal mode. Thus, the lockup operation is performed at a higher speed and the PLL operation is stabilized.

(c) Instead of outputting from the charge pump 24 a larger amount of current than the normal mode to perform the high-speed mode, the phase comparator 23 may output up-pulse and down-pulse signals having wider widths than during the normal mode. Alternatively, the VCO 26 may output an oscillation frequency signal having a higher frequency than during the normal mode.

The present examples and embodiments are to be considered as illustrative and not restrictive, and the invention is not to be limited to the details given herein, but may be modified within the scope and equivalence of the appended claims.

What is claimed is:

1. A mode control circuit for mode controlling a phase-locked loop (PLL) circuit having a high-speed mode in which a high-speed lockup operation is performed and a normal mode in which a normal PLL operation is performed, wherein the PLL circuit compares the phase of a reference signal and the phase of a comparison signal to generate a first pulse signal and a second pulse signal, and generates based on the first and second pulse signals a frequency signal that is locked at a desired frequency, wherein the mode control circuit receives the first and the second pulse signals from the PLL circuit, generates a mode switch signal representing the normal mode when a difference between a phase of the first pulse signal and a phase of the second pulse signal is within a predetermined range, and, after the mode is switched from the high-speed mode to the normal mode, generates the mode switch signal such that the normal mode is maintained, and wherein the mode control circuit stops the phase comparison of the first and second pulse signals in response to the mode switch signal representing the normal mode.

2. The mode control circuit according to claim 1, comprising a phase comparator connected to the PLL circuit to generate the mode switch signal representing one of the high-speed mode and the normal mode by comparing the phase of the first pulse signal and the phase of the second pulse signal, wherein, after the mode switch signal is fed back to the phase comparator and the phase comparator switches the mode from the high-speed mode to the normal mode, in response to the mode switch signal representing the normal mode, the phase comparator maintains outputting the mode switch signal indicating the normal mode.

3. A mode control circuit for mode controlling a phase-locked loop (PLL) circuit having a high-speed mode in which a high-speed lockup operation is performed and a normal mode in which a normal PLL operation is performed, wherein the PLL circuit compares the phase of a reference signal and the phase of a compassion signal to generate a first pulse signal and a second pulse signal, and generates based on the first and second pulse signals a frequency signal that is locked at a desired frequency, wherein the mode control circuit receives the first and the second pulse signals from the PLL circuit, generates a mode switch signal representing the normal mode when a difference between a phase of the first pulse signal and a phase of the second pulse signal is within a predetermined range, and, after the mode is switched from the high-speed mode to the normal mode, generates the mode switch signal such that the normal mode is maintained, and wherein the mode control circuit comprising a phase comparator connected to the PLL circuit to generate the mode switch signal representing one of the high-speed mode and the normal mode by comparing the phase of the first pulse signal and the phase of the second pulse signal, wherein, after the mode switch signal is fed back to the phase comparator and the phase comparator switches the mode from the high-speed mode to the normal mode, in response to the mode switch signal representing the normal mode, the phase comparator maintains outputting the mode switch signal indicating the normal mode, wherein the phase comparator includes:
a first gate circuit for receiving the first pulse signal and the mode switch signal and outputting the first pulse signal in response to the mode switch signal representing the high-speed mode, wherein the first gate circuit inhibits the output of the first pulse signal in response to the mode switch signal representing the normal mode; and
a second gate circuit for receiving the second pulse signal and the mode switch signal and outputting the second pulse signal in response to the mode switch signal representing the high-speed mode, wherein the second gate circuit inhibits the output of the second pulse signal in response to the mode switch signal representing the normal mode.

4. The mode control circuit according to claim 3, wherein the phase comparator includes:
a first flip-flop having a data input terminal connected to the output of the first gate circuit, a clock terminal connected to the output of the second gate circuit, and an inverting output terminal;
a delay circuit for generating a delay signal by delaying the second pulse signal output from the second gate circuit by a predetermined delay time;
a second flip-flop having a data input terminal connected to the output of the first gate circuit, a clock terminal for receiving the delay signal from the delay circuit, and an output terminal; and
a third gate circuit connected to the inverting output terminal of the first flip-flop and the output terminal of the second flip-flop, wherein the third gate circuit outputs the mode switch signal.

5. A mode control circuit for mode controlling a phase-locked loop (PLL) circuit having a high-speed mode in which a high-speed lockup operation is performed and a normal mode in which a normal PLL operation is performed, wherein the PLL circuit compares the phase of a reference signal and the phase of a comparison signal to generate a first pulse signal and a second pulse signal, and generates based on the first and second pulse signals a frequency signal that is locked at a desired frequency, wherein the mode control circuit receives the first and the second pulse signals from the PLL circuit, generates a mode switch signal representing the normal mode when a difference between a phase of the first pulse signal and a phase of the second pulse signal is within a predetermined range, and, after the mode is switched from the high-speed mode to the normal mode, generates the mode switch signal such that the normal mode is maintained, and wherein the mode control circuit comprising a phase comparator connected to the PLL circuit to generate the mode switch signal representing one of the high-speed mode and the normal mode by comparing the phase of the first pulse signal and the phase of the second pulse signal, wherein, after the mode switch signal is fed back to the phase comparator and the phase comparator switches the mode from the high-speed mode to the normal mode, in response to the mode switch signal representing the normal mode, the phase comparator maintains outputting the mode switch signal indicating the normal mode, wherein the phase comparator includes:

a first flip flop having a data input terminal for receiving the first pulse signal, a clock terminal for receiving the second pulse signal, an inverting output terminal, and a reset terminal for receiving the mode switch signal;

a delay circuit for generating a delay signal by delaying the second pulse signal by a predetermined delay time;

a second flip-flop having a data input terminal for receiving the first pulse signal, a clock terminal for receiving the delay signal from the delay circuit, an output terminal, and a set terminal for receiving the mode switch signal; and a gate circuit connected to the inverting output terminal of the first flip-flop and the output terminal of the second flip-flop, wherein the gate circuit outputs the mode switch signal.

6. The mode control circuit according to claim 1 comprising:

a phase comparator for comparing the phase of the first pulse signal and the phase of the second pulse signal to generate a comparison result signal; and a latch circuit connected to the phase comparator to latch the comparison result signal and generate the mode switch signal.

7. A mode control circuit for mode controlling a phase-locked loop (PLL) circuit having a high-speed mode in which a high-speed lockup operation is performed and a normal mode in which a normal PLL operation is performed, wherein the PLL circuit compares the phase of a reference signal and the phase of a comparison signal to generate a first pulse signal and a second pulse signal, and generates based on the first and second pulse signals a frequency signal that is locked at a desired frequency, wherein the mode control circuit receives the first and the second pulse signals from the PLL circuit, generates a mode switch signal representing the normal mode when a difference between a phase of the first pulse signal and a phase of the second pulse signal is within a predetermined range, and, after the mode is switched from the high-speed mode to the normal mode, generates the mode switch signal such that the normal mode is maintained, and wherein the mode control circuit comprising:

a phase comparator for comparing the phase of the first pulse signal and the phase of the second pulse signal to generate a comparison result signal; and a latch circuit connected to the phase comparator to latch the comparison result signal and generate the mode switch signal, wherein the phase comparator includes:

a first flip-flop having a data input terminal for receiving the first pulse signal, a clock terminal for receiving the second pulse signal, and an inverting output terminal;

a delay circuit for generating a delay signal by delaying the second pulse signal by a predetermined delay time;

a second flip-flop having a data input terminal for receiving the first pulse signal, a clock terminal for receiving the delay signal from the delay circuit, and an output terminal; and an AND circuit connected to the inverting output terminal of the first flip-flop and the output terminal of the second flip-flop, wherein the AND circuit outputs the comparison result signal.

8. A mode control circuit for mode controlling a phase-locked loop (PLL) circuit having a high-speed mode in which a high-speed lockup operation is performed and a normal mode in which a normal PLL operation is performed, wherein the PLL circuit compares the phase of a reference signal and the phase of a comparison signal to generate a first pulse signal and a second pulse signal, and generates based on the first and second pulse signals a frequency signal that is locked at a desired frequency, wherein the mode control circuit receives the first and the second pulse signals from the PLL circuit, generates a mode switch signal representing the normal mode when a difference between a phase of the first pulse signal and a phase of the second pulse signal is within a predetermined range, and, after the mode is switched from the high-speed mode to the normal mode, generates the mode switch signal such that the normal mode is maintained, wherein the mode control circuit includes:

a phase comparator for comparing the phase of the first pulse signal and the phase of the second pulse signal to generate a comparison result signal; and a first flip-flop connected to the phase comparator, wherein the flip-flop has a clock input terminal for receiving the comparison result signal, a data input terminal connected to a predetermined potential, and an output terminal for outputting the mode switch signal.

9. The mode control circuit according to claim 8, wherein the phase comparator includes:

a first flip-flop having a data input terminal for receiving the first pulse signal, a clock terminal for receiving the second pulse signal, and an inverting output terminal;

a delay circuit for generating a delay signal by delaying the second pulse signal by a predetermined delay time;

a second flip-flop having a data input terminal for receiving the first pulse signal, a clock terminal for receiving the delay signal from the delay circuit, and an output terminal; and an AND circuit connected to the inverting output terminal of the first flip-flop and the output terminal of the second flip-flop, wherein the AND circuit outputs the comparison result signal.

10. A mode control circuit for mode controlling a phase-locked loop (PLL) circuit having a high-speed mode in which a high-speed lockup operation is performed and a normal mode in which a normal PLL operation is performed, wherein the PLL circuit compares the phase of a reference signal and the phase of a comparison signal to generate a first pulse signal and a second pulse signal, and generates based on the first and second pulse signals a frequency signal that is locked at a desired frequency, wherein the mode control circuit receives the first and the second pulse signals from the PLL circuit, generates a mode switch signal representing the normal mode when a difference between a phase of the first pulse signal and a phase of the second pulse signal is within a predetermined range, and, after the mode is switched from the high-speed mode to the normal mode, generates the mode switch signal such that the normal mode is maintained, and wherein the mode control circuit generates the mode switch signal representing the high-speed mode in response to an initialization signal.

11. A semiconductor device comprising:

a PLL circuit having a high-speed mode in which a high-speed lockup operation is performed and a normal mode in which a normal PLL operation is performed, wherein the PLL circuit compares the phase of a reference signal and the phase of a comparison signal to generate a first pulse signal and a second pulse signal and generates based on the first and second pulse signals frequency signal that is locked at a desired frequency; and a mode control circuit connected to the PLL circuit to control the mode of the PLL circuit, wherein the mode control circuit receives the first and second pulse signals from the PLL circuit, generates a mode switch signal representing the normal mode when a difference between a phase of the first pulse signal and a phase of the second pulse signal is within a predetermined range, and, after the mode is switched from the high-speed mode to the normal mode, generates the mode switch signal such that the normal mode is maintained, and wherein the mode control circuit stops the phase comparison of the first and second pulse signals in response to the mode switch signal representing the normal mode.

12. The semiconductor device according to claim 11, wherein the PLL circuit includes:

a phase comparator for comparing the phase of the reference signal and the phase of the comparison signal to generate the first and second pulse signals;

a charge pump connected to the phase comparator to generate a charge pump output signal having a current value that is based on the first and second pulse signals;

a low-pass filter connected to the charge pump to generate a control signal by smoothing the charge pump output signal; and a voltage-controlled oscillator connected to the low-pass filter to generate an oscillation frequency signal based on the control signal, wherein the charge pump generates the charge pump output signal with a current value greater than that in the normal mode when the mode switch signal represents the high-speed mode.

13. The semiconductor device according to claim 11, wherein the PLL circuit includes:

a phase comparator for comparing the phase of the reference signal and the phase of the comparison signal to generate the first and second pulse signals;

a charge pump connected to the phase comparator to generate a charge pump output signal having a current value that is based on the first and second pulse signals;

a low-pass filter connected to the charge pump to generate a control signal by smoothing the charge pump output signal; and a voltage-controlled oscillator connected to the low-pass filter to generate an oscillation frequency signal based on the control signal, wherein the phase comparator generates the first and second pulse signals with pulse widths greater than that in the normal mode when the mode switch signal represents the high-speed mode.

14. The semiconductor device according to claim 11, wherein the PLL circuit includes:

a phase comparator for comparing the phase of the reference signal and the phase of the comparison signal to generate the first and second pulse signals;

a charge pump connected to the phase comparator to generate a charge pump output signal having a current value that is based on the first and second pulse signals;

a low-pass filter connected to the charge pump to generate a control signal by smoothing the charge pump output signal; and a voltage-controlled oscillator connected to the low-pass filter to generate an oscillation frequency signal based on the control signal, wherein the voltage-controlled oscillator generates the oscillation frequency signal having a frequency greater than that in the normal mode when the mode switch signal represents the high-speed mode.

15. A semiconductor device comprising:

a PLL circuit having a high-speed mode in which a high-speed lockup operation is performed and a normal mode in which a normal PLL operation is performed, wherein the PLL circuit compares the phase of a reference signal and the phase of a comparison signal to generate a first pulse signal and a second pulse signal, and generates based on the first and second pulse signals a frequency signal that is locked at a desired frequency;

a mode control circuit connected to the PLL circuit to control the mode of the PLL circuit, wherein the mode control circuit receives the first and second pulse signals from the PLL circuit, generates a mode switch signal representing the signal mode when the difference between a phase of the first pulse signal and a phase of the second pulse signal is within a predetermined range, and, after the mode is switched from the high-speed mode to the normal mode, generates the mode switch signal such that the normal mode is maintained; and an initialization circuit connected to the mode control circuit, wherein the initialization circuit receives a power save signal, a frequency dividing ratio setting signal, and a mode switch signal and generates an initialization signal provided to the mode control circuit.

* * * * *